United States Patent [19]
Fierkens

[11] Patent Number: 5,155,902
[45] Date of Patent: Oct. 20, 1992

[54] METHOD OF PACKAGING A SEMICONDUCTOR DEVICE

[76] Inventor: Richard H. J. Fierkens, Keurbeck, 6914 AE Herwen, Netherlands

[21] Appl. No.: 736,792

[22] Filed: Jul. 29, 1991

[51] Int. Cl.$^5$ ............................................. H01R 43/00
[52] U.S. Cl. .................................... 29/827; 140/105; 174/52.4; 206/328
[58] Field of Search ............... 29/827, 825; 174/52.4; 140/105; 206/328, 331, 332

[56] References Cited

U.S. PATENT DOCUMENTS

| | | | |
|---|---|---|---|
| 4,553,420 | 11/1985 | Fierkens et al. | 29/827 X |
| 4,706,811 | 11/1987 | Jung | 174/52.4 X |
| 4,747,017 | 5/1988 | Koors | 174/52.4 X |
| 5,027,866 | 7/1991 | Matsumoto | 140/105 |

FOREIGN PATENT DOCUMENTS 3-22467  1/1991  Japan .................................. 29/827

Primary Examiner—Carl J. Arbes
Attorney, Agent, or Firm—Harry M. Weiss

[57] ABSTRACT

A semiconductor device comprising a semiconductor unit with leads extending therefrom is placed on a bottom packaging tray having a die-shaped upper surface. A top lubricating type film is used over the device 10 and below a punch unit that is used to bend the leads. A process of assembling the semiconductor device on a die type package is disclosed which includes placing the semiconductor device with leads on a packaging tray with upper lead-shaped baring surfaces, placing an anti-friction film sheet over the tray and over the device with its leads extending therefrom, and actuating a punch unit disposed above the film sheet, thereby forming or bending the leads and simultaneously using the die type tray for packaging the semiconductor device.

10 Claims, 1 Drawing Sheet

METHOD OF PACKAGING A SEMICONDUCTOR DEVICE

The invention generally relates to package for a semiconductor device and packaging methods therefor, and, in particular, the invention relates to a package for a semiconductor device and packaging method therefor comprising a semiconductor unit having a plurality of leads and die-shaped container for both supporting the semiconductor unit and for forming or shaping the leads thereof to a desired configuration.

BACKGROUND OF THE INVENTION

In the past, semiconductor devices were provided with leads extending outwardly from a semiconductor unit and these leads often needed to be bent so that they could, for example, extend through via holes in a printed circuit board thereby interconnecting a number of these semiconductor devices into a desired circuit or system. The related method of manufacture of the semiconductor device with the leads therefore included inserting the leads of the semiconductor device at a station prior to forming the plastic encapsulation that united the leads to the semiconductor portion and included packaging the semiconductor device at the assembly line last station with the leads extending outwardly (unformed) parallel to the semiconductor portion of the device. Usually, a totally separate lead bending operation was carried out to bend the leads to a desired configuration for a particular intended purpose prior to a subsequent and separate packaging procedure that was needed to both support and package the semiconductor device with its bent leads.

One problem with the prior art method of bending the leads and subsequently packaging the semiconductor device with the bent leads is that it was difficult to minimize or reduce the labor time and resultant costs for packaging the semiconductor device with bent leads. Another problem was to avoid damaging the bent leads (which need to be kept bent in accordance with a pre-set specification) during the process of packaging the semiconductor device.

SUMMARY OF THE INVENTION

One object of the present invention is to provide an improved package for a semiconductor device and a method of packaging a semiconductor device.

Another object of the invention is to provide a package and method which permits forming and shaping the leads of a semiconductor device.

A further object of the invention is to provide a package and method which minimizes the labor time of packaging a semiconductor device with formed leads.

BRIEF DESCRIPTION OF PREFERRED INVENTION

According to the present invention, a semiconductor device is provided. This semiconductor device comprises a semiconductor unit and a bottom die-shaped container which serves to both form the leads of the semiconductor device and to remain as a bottom support package for the semiconductor device with its bent leads.

By using the die-shaped bottom container and a lubricating type top film beneath a forming tool for cooperating with the die-shaped bottom container, the forming of the semiconductor device's leads and the packaging of the semiconductor device or a plurality of semiconductor devices with their bent leads in a container can be done in one operation at one station thereby minimizing the packaging labor time.

Also, according to the invention, a process of manufacture is provided. This process includes the steps of, positioning a die-shaped tray under a forming tool, placing a semiconductor device which has formable leads upon the die-shaped tray under the forming tool, placing a lubricating film sheet over the semiconductor device and under the forming tool, and actuating the forming tool thereby forming the semiconductor device's leads and simultaneously providing the die-shaped tray as a support package for the semiconductor device with its bent leads.

The foregoing and other objects, features and advantages will be apparent from the following description of the preferred embodiment of the invention as illustrated in the accompanying drawings.

DESCRIPTION OF THE PREFERRED EMBODIMENT

Figure 1:
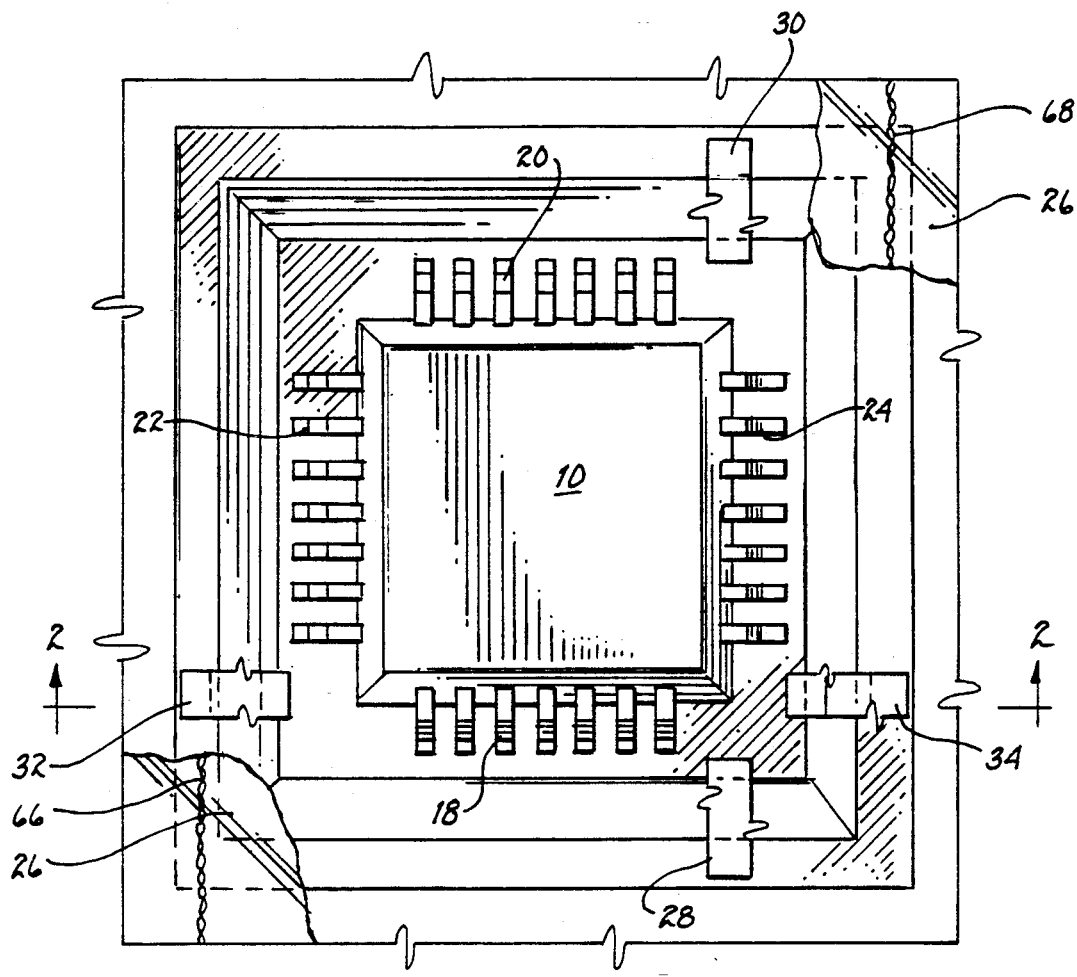
FIG. 1 is a plan or top view of a semiconductor device according to the present invention showing leads extending from the four sides of the semiconductor device.
Figure 2:
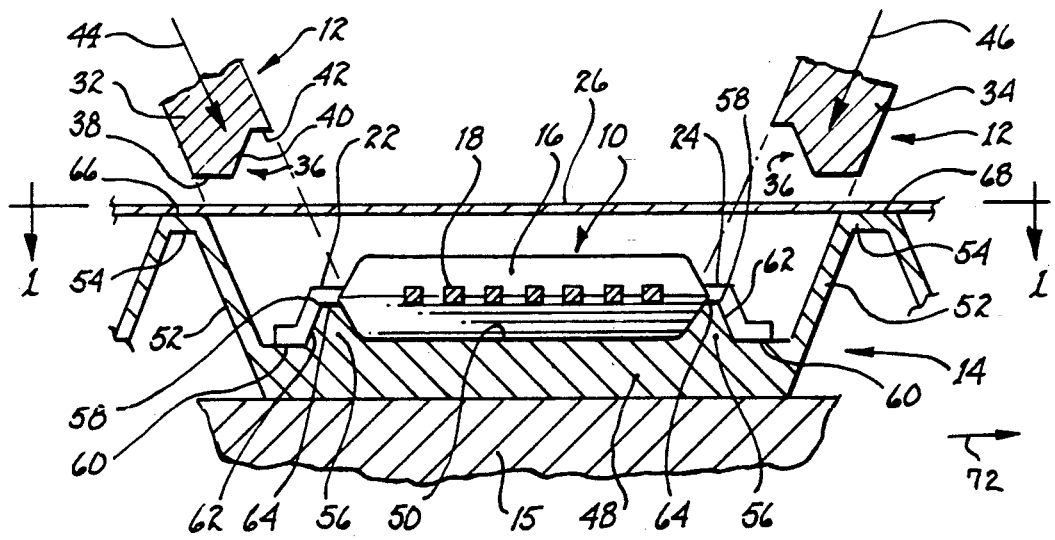
FIG. 2 is a section view as taken along the line 2—2 of FIG. 1.

As shown in FIGS. 1 and 2, a semiconductor device 10 is provided. The semiconductor device 10 is provided with four sets of leads on each of the four sides of the device 10 as shown in FIG. 1. If desired, the method and package of this invention can be implemented with a semiconductor device having, for example, two sets of leads (Dual-In-Line or DIP package).

Device 10 is worked on by a coaxial punch unit 12 (see FIG. 2) disposed at the last station of a line used to manufacture semiconductor devices with bent leads. For the device 10 of FIG. 1, four of these punch units 12 would be used (one for each of the four sets of leads located in the four sides of the device 10). Beneath the device 10 is a preferably plastic die unit or anvil or blister pack unit 14 (see FIG. 2). Device 10 comprises a semiconductor portion or unit 16, which is disposed on die unit 14. Semiconductor unit 16 has plurality of front leads 18, a plurality of rear leads 20, a plurality of left leads 22, and a plurality of right leads 24 (see FIG. 1). Leads 18, 20, 22, 24 are shaped (into the bent lead configuration shown in FIG. 2) between punch unit 12 and die unit 14, after a downward movement of punch unit 12 as more fully described below. The shape of the bent leads (after the bending operation) shown in FIG. 2 permits the Quad Package (the device 10 with its four sides of leads) to be surface mounted on a printed circuit board. The leads 18, 20, 22 and 24 are already solder plated leads (i.e. lead-tin plating).

A lubricating film or anti-friction plastic foil 26 is shown (see FIG. 2) disposed over the semiconductor device 10 and is used to reduce friction between the punch units 12 and die unit 14 during the punch-die combined process or method to shape the leads 22 and 24 as shown in FIG. 2. Die unit 14 forms a bottom packing container, tray or pan. Die unit 14 and foil 26 are preferable made of selective plastic with the plastic foil 26 being made of a thin, flexible plastic that avoids possible damage to the somewhat fragile leads in the punch units 12 during the lead bending operation whereas the die unit 14 is preferably made of a hard blister pack type plastic. Thus, the plastic film 26 serves as thin lubricating and barrier film to act as or provide a lubricant for the punch units 12 during the lead bending process to avoid damage to the leads and, additionally, serves to keep the punch units 12 clean of any solder (lead-tin solder) that might come off the solder plated leads which would contaminate the punch units 12.

Punch unit 12 includes a front punch 28 for bending the row of leads 18, a rear punch 30 for bending the row of leads 20, a left punch 32 for bending the row of leads 22, and a right punch 34 for bending the row of leads 24 (only a portion of punches 28, 30, 32 and 34 are shown in FIG. 1). Punch unit 12 (which includes punches 28, 30, 32, and 34) operate on or contact a top surface portion of foil 26 during the bent lead forming operation.

Left punch 32 (see FIG. 2), which is identical in structure and operation, to punches 28, 30, 34, has a bearing face 36, that has three surfaces 38, 40, 42 for shaping left leads 22. Left punch 32 applies a downward force 44 on left leads 22 during the bending thereof. Right punch 34, (see FIG. 2), like left punch 32, simultaneously applies a downward force 46 on right leads 24. Punch unit 12 also has an upper portion (not shown) for simultaneously actuating and guiding punches 28, 30, 32, 34 so that the four sets of leads 18, 20, 22, and 24 are bent simultaneously. The punches 28, 30, 32 and 34 of the punch unit 12 can either be separate units that are actuated simultaneously or, if desired, they can be integrated or connected together as a one-piece unit.

Die unit 14 has a base portion 48, which has a selectively shaped upper surface 50 that is used to support the bottom of the device 10. Base 48 has a frame-shaped or four-sided inclined edge wall 52 (only two of which are shown in FIG. 2), which has a four-sided flat top portion 54 (only two of which are shown in FIG. 2). Upper surface 50 has a four-sided protrusion or projection 56 (only two of which are shown in FIG. 2) each of which has an upper bearing face or surface 58. Each face or surface 58 has three die type surface portions 60, 62, 64, which are respectively disposed opposite to surfaces 38, 40, 42 of each of the punches 28, 30, 32 and 34 to permit bending of the leads 18, 20, 22 and 24 to conform to the shape provided by the surfaces 38, 40, 42 and 44 of each punch 28, 30, 32 and 34 and the corresponding surface portions 60, 62, and 64 of the die unit 14.

In the concurrent or simultaneous lead forming and semiconductor packaging operational step, leads 18, 20, 22, 24 are formed or bent by means of the respective punches 28, 30, 32 and 34 cooperating with the four protrusions 56 and the semiconductor device 10 is packaged for shipping purposes using the underlying or supporting die unit or tray 14. If desired, foil 26 has perforations 66, 68 (see FIG. 1) for ease of separating portions thereof to facilitate disposing of the foil 26 after the use thereof in the lead forming or bending operation. After such an operational step, the semiconductor device 10 as a fully packaged unit on the die unit or tray 14 is off-loaded away from X-Y table 15 (see FIG. 2). Subsequently, the total package including the semiconductor device 10 with its underlying die unit or tray 14 is preferably moved in a direction 72 to an off-loading station (not shown). In this way, bending of leads 18, 20, 22, 24 and simultaneously providing the bottom packaging portion 14, is achieved prior to off-loading the entire package at a last production line station.

The process of manufacture of device 10 includes the steps as indicated hereafter. Position a die-shaped packaging tray 14 under a punch unit 12. Place a semiconductor device 10 having a semiconductor unit 16 which has formable leads 18, 20, 22, 24 (after the solder plating thereof) in the tray 14 and submit the tray 14 with the device 10 thereon under the punch unit 12 after placing an anti-friction preferably plastic film sheet 26 above the semiconductor device 10 and under the punch unit 12. Actuate the punch unit 12 thereby forming or bending the leads 18, 20, 22, 24 and subsequently transporting the entire packaged unit (the device 10 on the die unit or tray 14) for shipping purposes.

The advantages of the combined blister package 14 with its device 10 are indicated thereafter.

A. Labor time for packaging the semiconductor device 10 is minimized.

B. In a process of manufacture, leads 18, 20, 22, 24 of the semiconductor device 10 are shaped and formed, while simultaneously a bottom packaging tray 14 (which also serves in the bending of the leads) is provided.

C. The speed in the packaging of the device 10 is increased and the cost of manufacture of a packaged semiconductor device 10 is minimized, as compared to the prior art packaged semiconductor devices.

D. The leads during the method of bending (forming) these leads are not damaged and will not be damaged in the packaging of the semiconductor devices because the bent leads are kept in place or in their bent position because they are bent and simultaneously located in the supporting tray or blister package.

While the invention has been described in its preferred embodiment, it is to be understood that the words which have been used are words of description rather than limitation and that changes may be made within the purview of the appended claims without departing from the true scope and spirit of the invention in its broader aspects.

The embodiment of an invention in which an exclusive property or right is claimed and defined as follows:

1. A method for providing a packaged semiconductor device including the steps of:
    placing a semiconductor device which has a plurality of straight leads in a die-shaped tray; and
    bending said plurality of leads by using a punch to shape said plurality of leads into the configuration of said die-shaped tray; further including the step of first placing an anti-friction film sheet above the tray above the semiconductor device and under the punch prior to the lead bending step.

2. The method of claim 1 including the step of actuating the punch thereby forming the leads while using said sheet as both a punch lubricant and a barrier of contamination.

3. The method of claim 2 including the step of leaving the semiconductor device in contact with the tray as a package for said device.

4. The method of claim 3 including the step of off-loading the device with its supporting tray package after the punch operation.

5. The method of claim 11 including the step of:
    forming the tray from an impact-resistant plastic material before the step of placing the semiconductor device in the tray.

6. The method of claim 1 including the step of:

forming the film sheet from an anti-friction plastic material before the step of placing the film sheet above the tray.

7. The method of claim 6 including the step of:
removing the plastic film sheet after the step of bending said plurality of leads.

8. A method for packaging a semiconductor device comprising a semiconductor portion and a plurality of straight leads, including steps of:
placing said semiconductor device in a container comprising unitary die-shaped tray means which include a base portion supporting said semiconductor portion of said semiconductor device and edge walls extending above said semiconductor device, and
bending said plurality of straight leads of said semiconductor device by using a punch to shape said plurality of straight leads into the configuration of said die shaped tray means.

9. The method of claim 8 further including placing a plurality of said semiconductor devices in said container with each one of said plurality of semiconductor devices being placed on its own base portion of its own die-shaped tray means.

10. A method for packaging a semiconductor device including the steps of:
placing a semiconductor device which has a plurality of straight leads in a die-shaped tray means which includes a base portion supporting said semiconductor device and edge walls extending above said semiconductor device,
placing a film sheet above said die-shaped tray means, and
bending said plurality of leads by using a punch in contact with said film sheet to shape said plurality of straight leads located beneath said film sheet into the configuration of said die-shaped tray means.

* * * * *

UNITED STATES PATENT AND TRADEMARK OFFICE
CERTIFICATE OF CORRECTION

PATENT NO. : 5,155,902
DATED : October 20, 1992
INVENTOR(S) : Richard H.J. Fierkens It is certified that error appears in the above-indentified patent and that said Letters Patent is hereby corrected as shown below:

Column 4, claim 5, line 1, change "11" to —1—.

Signed and Sealed this

Fifteenth Day of November, 1994

Attest:

BRUCE LEHMAN

*Attesting Officer*        *Commissioner of Patents and Trademarks*